(12) United States Patent
Scott et al.

(10) Patent No.: US 7,554,808 B2
(45) Date of Patent: Jun. 30, 2009

(54) HEAT SINK WITH THERMOELECTRIC MODULE

(75) Inventors: Brian A. Scott, El Dorado Hills, CA (US); Paul J. Gwin, Orangevale, CA (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 287 days.

(21) Appl. No.: 11/472,927

(22) Filed: Jun. 22, 2006

(65) Prior Publication Data

US 2007/0297139 A1   Dec. 27, 2007

(51) Int. Cl.
*H05K 7/20* (2006.01)
*F25B 21/02* (2006.01)
*F28F 7/00* (2006.01)
*H01L 23/34* (2006.01)

(52) U.S. Cl. ............... 361/710; 361/718; 62/3.2; 62/3.7; 165/80.2; 165/80.3; 174/16.1; 174/16.3; 257/720; 257/722

(58) Field of Classification Search ............. 361/704, 361/706, 711–719; 62/3.2, 3.7; 165/80.2, 165/80.3; 174/16.1, 16.3; 257/713, 720–722
See application file for complete search history.

(56) References Cited

U.S. PATENT DOCUMENTS

| 4,689,659 | A | * | 8/1987 | Watanabe | 327/512 |
|---|---|---|---|---|---|
| 2004/0108104 | A1 | * | 6/2004 | Luo | 165/181 |
| 2005/0121776 | A1 | * | 6/2005 | Deppisch et al. | 257/712 |
| 2006/0048519 | A1 | * | 3/2006 | Childress | 62/3.3 |

* cited by examiner

*Primary Examiner*—Jayprakash N Gandhi
*Assistant Examiner*—Zachary M Pape
(74) *Attorney, Agent, or Firm*—Buckley, Maschoff & Talwalkar LLC

(57) ABSTRACT

An apparatus may include a thermally-conductive heat sink core having at least one surface, a solid-state heat pump including a first surface and a second surface, the first surface in contact with the at least one surface of the core, and a thermally-conductive unit in contact with the second surface of the solid-state heat pump. Also included may be a stop in contact with the thermally-conductive unit, disposed at least partially over the first end of a cavity defined by the thermally-conductive unit, and defining an opening, and a fastener passing through the cavity, in contact with the core, and to bias the core toward the stop.

32 Claims, 9 Drawing Sheets

US 7,554,808 B2

HEAT SINK WITH THERMOELECTRIC MODULE

BACKGROUND

Electrical systems, such as computers, are comprised of multiple electrical components (e.g., processors, voltage regulators, and/or memory devices). Electrical components typically dissipate unused electrical energy as heat, which may damage the electrical components and/or their surroundings (e.g., other electrical components and/or structural devices such as casings, housings, and/or electrical interconnects). Various means, such as heat sinks and heat pipes, have been utilized to direct dissipated heat away from electrical components and their surroundings.

The need for efficient heat management increases as electrical systems increase in processing speed and power. Typical heat mitigation devices may not be suitable for directing adequate amounts of heat away from electrical components in some scenarios. Conversely, improved heat management may allow the use of faster, more powerful and/or smaller electrical components.

DETAILED DESCRIPTION

Figure 1:
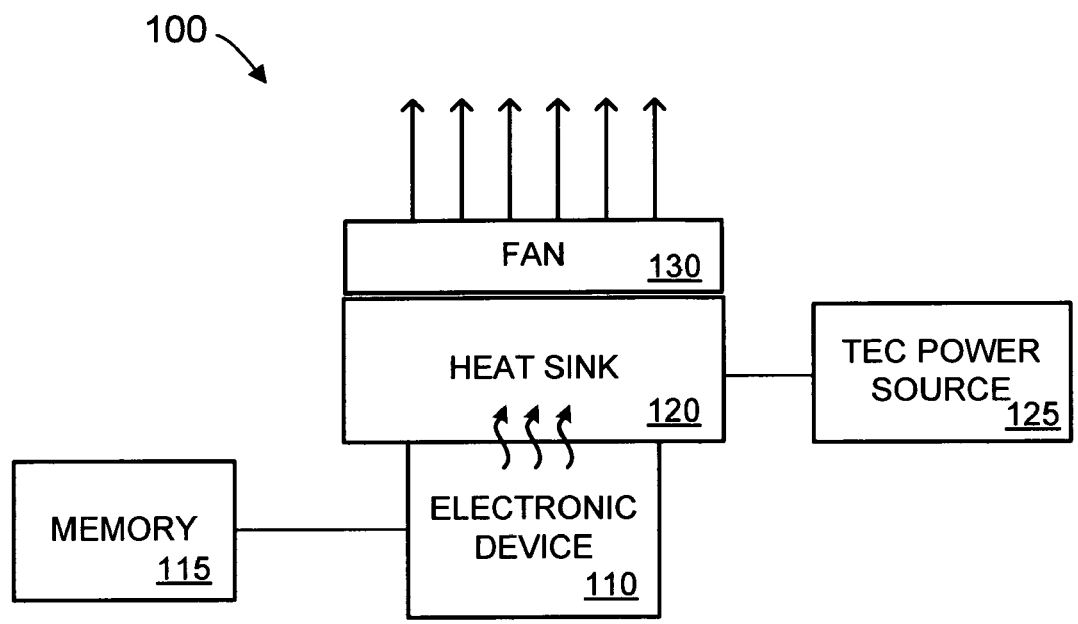
FIG. 1 is a block diagram of a system.

Referring first to FIG. 1, a block diagram of a system 100 is shown. The various systems described herein are depicted for use in explanation, but not limitation, of some embodiments. Different types, layouts, quantities, and configurations of any of the systems described herein may be used in some embodiments.

System 100 may comprise a computer motherboard. System 100 may include, as shown, electronic device 110, memory 115 electrically coupled to device 110, heat sink 120 coupled to device 110 and electrically coupled to thermoelectric (TEC) power source 125, and fan 130. In some embodiments, electronic device 110 may generate heat and/or may transfer heat to heat sink 120. The heat may travel through conduction, in some configurations, from electronic device 110 to heat sink 120 (e.g., as depicted via the wavy lines in FIG. 1). Fan 130 may, in turn, facilitate the dissipation of heat from the heat sink 120 as shown.

Electronic device 110 may, for example, be or include any device, object, and/or component that generates, stores, and/or requires removal of heat. For example, device 110 may include any number of processors, which may be of any type or configuration of processor, microprocessor, and/or microengine that is or becomes known or available. In this regard, memory 115 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

As will be described in detail below, heat sink 120 may include a thermally-conductive core, a solid-state heat pump (e.g., a TEC module) having a first surface in contact with the core, and a thermally-conductive unit in contact with a second surface of the heat pump. The thermally-conductive core may comprise a solid core or a heat pipe in accordance with some embodiments. In some embodiments, the thermally-conductive unit comprises a radial fin heat sink.

According to some embodiments, the core of heat sink 120 receives heat from electronic device 110 (or, more particularly, from an integrated heat spreader of electronic device 110). TEC power source 125 energizes the aforementioned heat pump to carry heat from its first surface to its second surface. The foregoing action increases a temperature gradient between the core and the first surface of the heat pump, which improves heat transfer from the core. Similarly, the heat pump action increases the temperature gradient and improves heat transfer between its second surface and the thermally-conductive unit.

Figure 2:
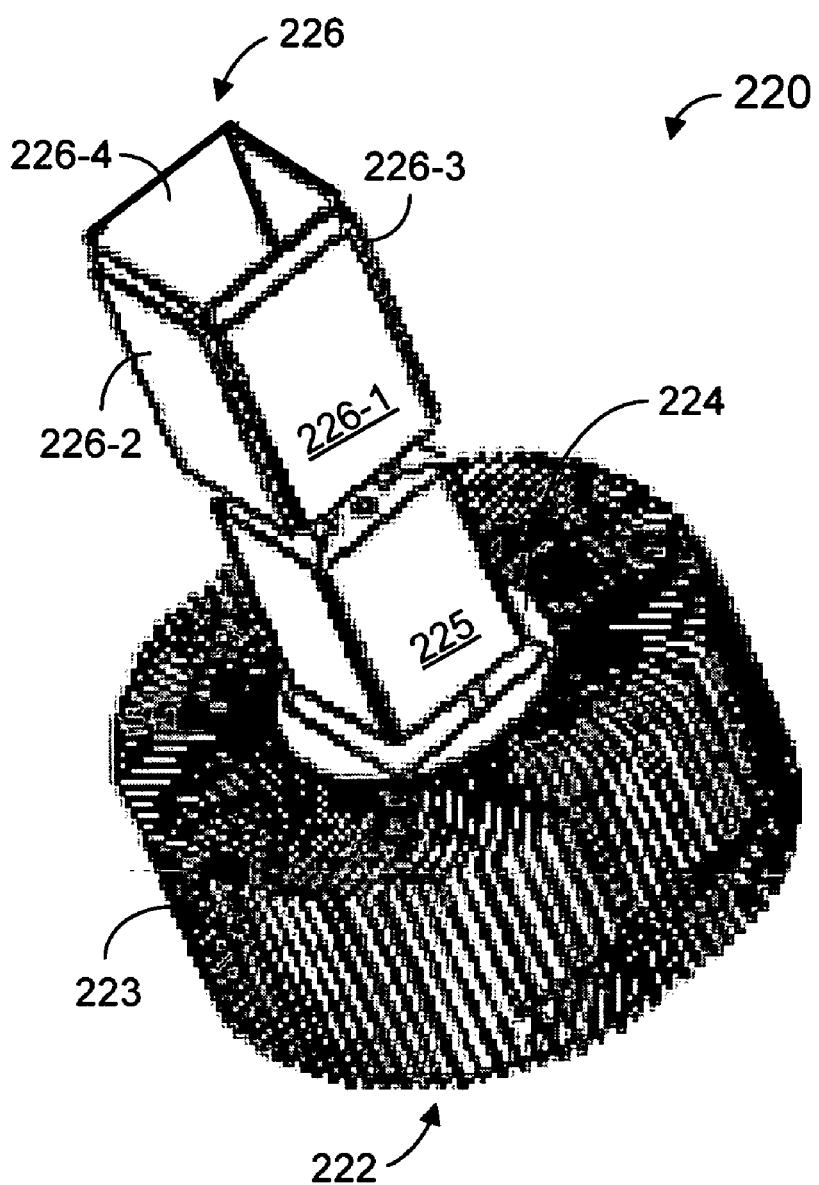
FIG. 2 is an exploded view of a system according to some embodiments.
Figure 3:
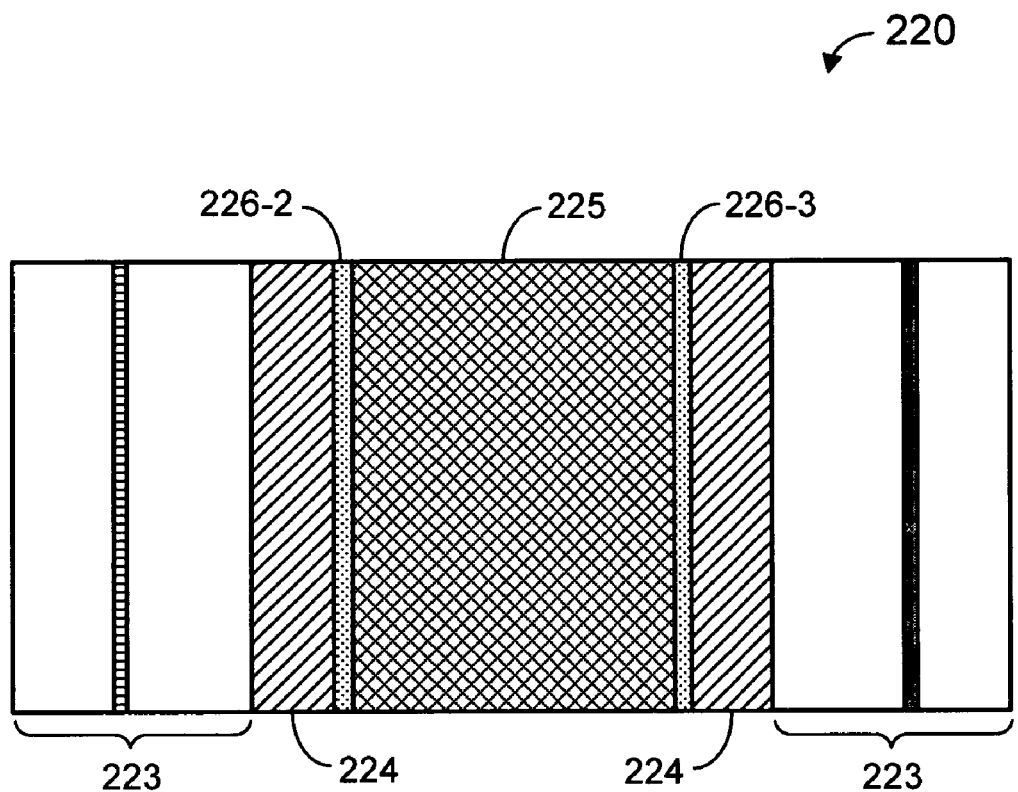
FIG. 3 is a cross-sectional diagram of the FIG. 2 system according to some embodiments.

Turning to FIG. 2, an exploded view of heat sink 220 according to some embodiments is shown. In some embodiments, heat sink 220 may be similar to heat sink 120 described in conjunction with FIG. 1. Fewer or more components than are shown in FIG. 2 may be included in the heat exchanger 220 in some embodiments. FIG. 3 is a cross-sectional view of heat sink 220 according to some embodiments.

Heat sink 220 may comprise radial fin heat sink 222 including fins 223 and base 224. Fins 223 may comprise curved fins, straight fins, and/or any other fin configuration that is or becomes known. Base 224 defines a cavity in which thermally-conductive core 225 and TEC modules 226 are disposed. In some embodiments, heat sink 220 may comprise aluminum and core 225 may comprise copper. Heat sink 220 and core 225 may comprise any other suitable materials according to some embodiments.

A first side of each of TEC modules 226 may be in contact with one side of core 225, while a second side of each of TEC modules 226 may be in contact with base 224 of unit 222. Application of DC power to TEC modules 226 may cause one side of each of modules 226 to decrease in temperature and the opposite side to increase in temperature.

Figure 4:
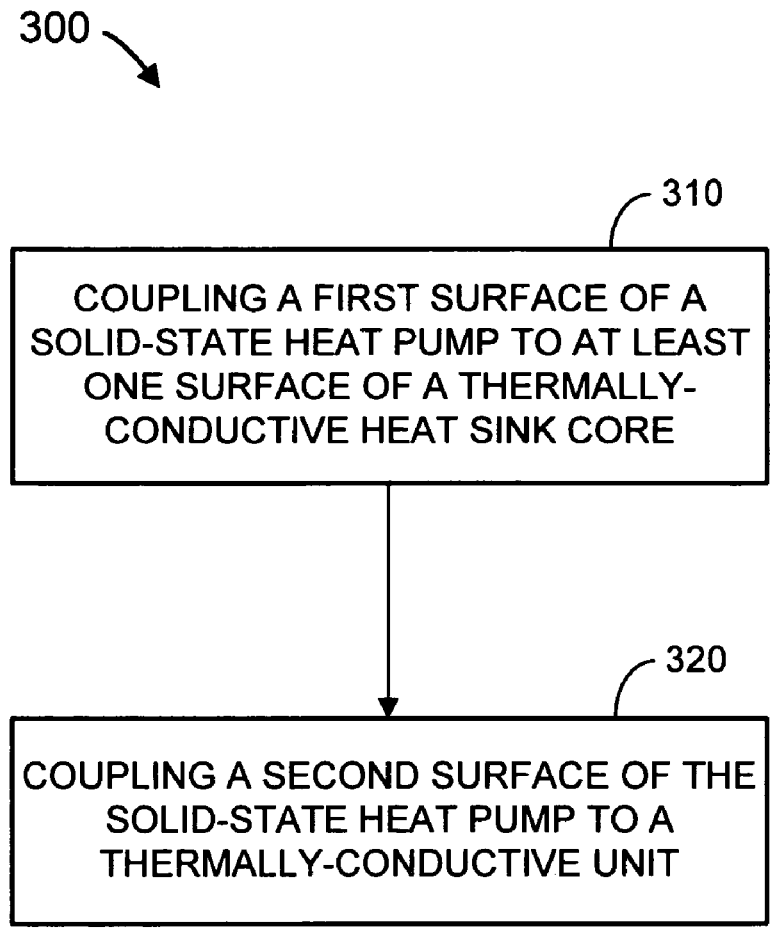
FIG. 4 is a flow diagram of a process according to some embodiments.

FIG. 4 is a flow diagram of process 300 according to some embodiments. Process 300 may be executed by a manufacturer of a heat sink according to some embodiments. Such a manufacturer might not necessarily manufacture any or all of the individual components used in process 300.

Initially, at 310, a first surface of a solid-state heat pump is coupled to at least one surface of a thermally-conductive heat sink core. Using heat sink 220 as an example, the "cold" surface of one of TEC modules 226 may be placed against core 225 at 310. A thermal interface material such as thermal grease may be placed between core 225 and the surface of the TEC module in some embodiments. For purposes herein, core 225 is considered to be in contact with the surface of the TEC module even if a thermal interface material is disposed therebetween.

Next, at 320, a second surface of the solid-state heat pump is coupled to a thermally-conductive unit. Continuing with the above example, core 225 and modules 226 may be placed into a cavity of unit 222 as shown in FIG. 2 according to some embodiments of 320. Such placement may result in coupling the "hot" surfaces of TEC modules 226 with base 224 of unit 222. Again, a thermal interface material may be disposed between modules 226 and base 224.

Figure 5:
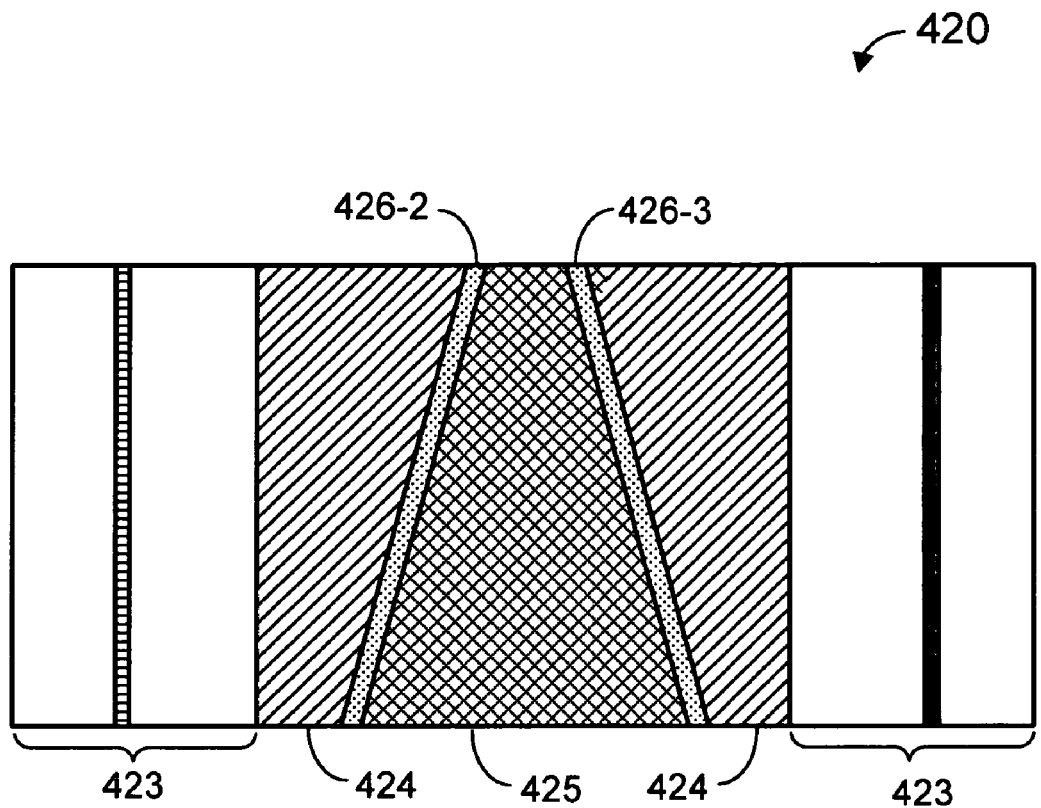
FIG. 5 is a cross-sectional diagram of a system according to some embodiments

FIG. 5 is a cross-sectional view of heat sink 420 according to some embodiments. In some embodiments, elements of heat sink 420 may be similar in composition to heat sinks 120, 220 described in conjunction with any of FIG. 1 through FIG. 3.

A width of a first end of core 425 is smaller than a width of a second end of core 425. Accordingly, a width of a first end of a cavity defined by base 424 is smaller than a width of a second end of the cavity. TEC modules 426-2 and 426-3 are angled to follow surfaces of core 425 and base 424 with which they are in contact. The arrangement illustrated in FIG. 5 may facilitate insertion and/or retention of core 425 and TEC modules 426-2 and 426-3 within base 424 of unit 422. Some embodiments of heat sink 420 may provide an improved thermal interface between core 425 and TEC modules 426 and between base 424 and TEC modules 426.

Figure 6:
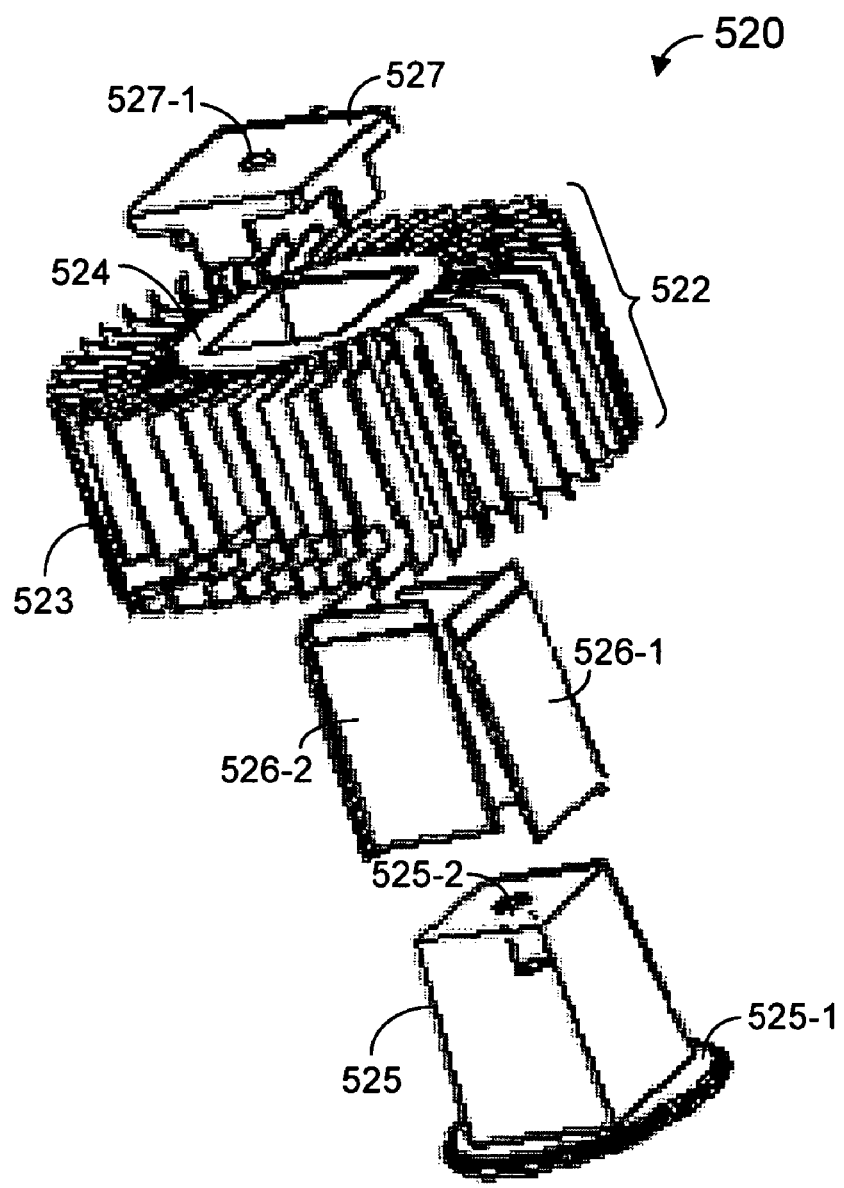
FIG. 6 is an exploded view of a system according to some embodiments.
Figure 7:
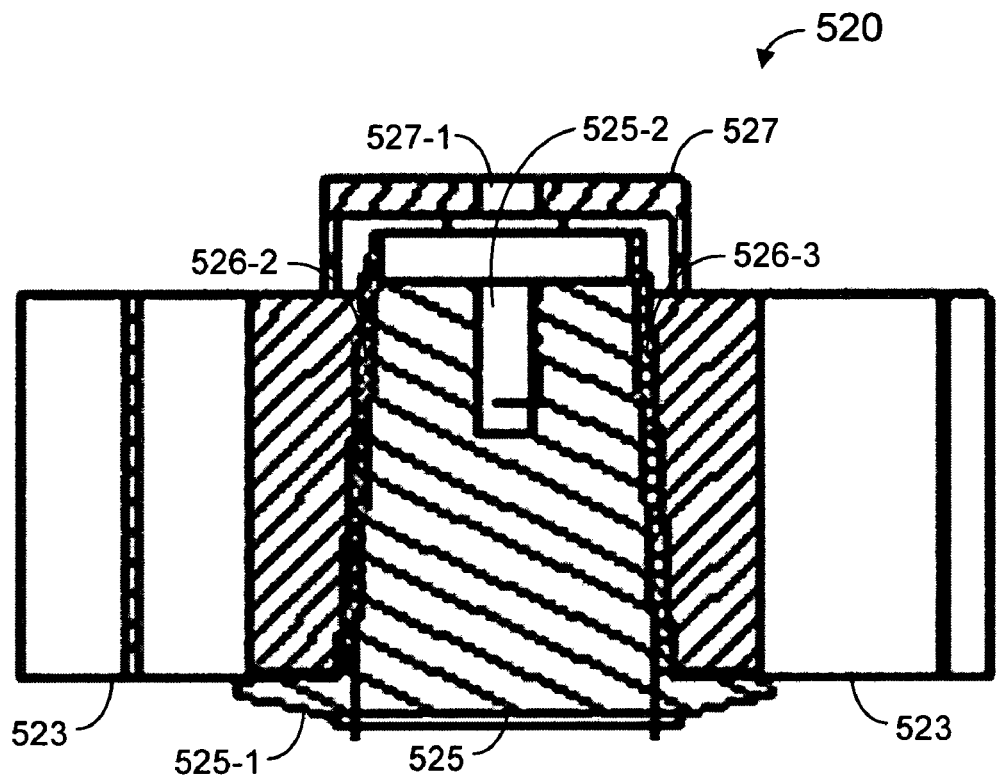
FIG. 7 is a cross-sectional diagram of the FIG. 6 system according to some embodiments.

FIG. 6 shows an exploded view and FIG. 7 shows a cutaway view of heat sink 520 according to some embodiments. Elements of heat sink 520 may be similar in composition to heat sinks 120, 220, and 420 described above.

Heat sink 520 includes tapered core 525. A width of a first end of core 525 may be smaller than a width of a second end of core 525. Core 525 may include integral or attached platform 525-1 and receptacle 525-2 according to some embodiments. Platform 525-1 may facilitate attachment of heat sink 520 to an electronic device such as device 110, and may also or alternatively assist in securing TEC modules 526 within heat sink 520. Receptacle 525-2 will be discussed below.

TEC modules 526 may be angled as described above with respect to FIG. 5, and a cavity defined by base 524 may be tapered to accept core 525 and the angled TEC modules 526. More particularly, a width of a first end of a cavity defined by base 524 may be smaller than a width of a second end of the cavity.

Heat sink 520 also includes stop 527 in contact with at least unit 522. Stop 527 is to facilitate biasing at least one surface of core 525 against one of TEC modules 526, and to facilitate biasing at least of TEC modules 526 against base 524 of unit 522. In this regard, stop 527 defines opening 527-1 to pass a fastener. Receptacle 525-2 of core 525 may receive such a fastener which may, for example, be secured thereto and tightened to bias core 525 toward stop 527 and to thereby bias the elements of heat sink 520 against one another. The fastener may comprise, but is not limited to, a rivet, a screw, a pin, and/or any combination thereof.

Figure 8:
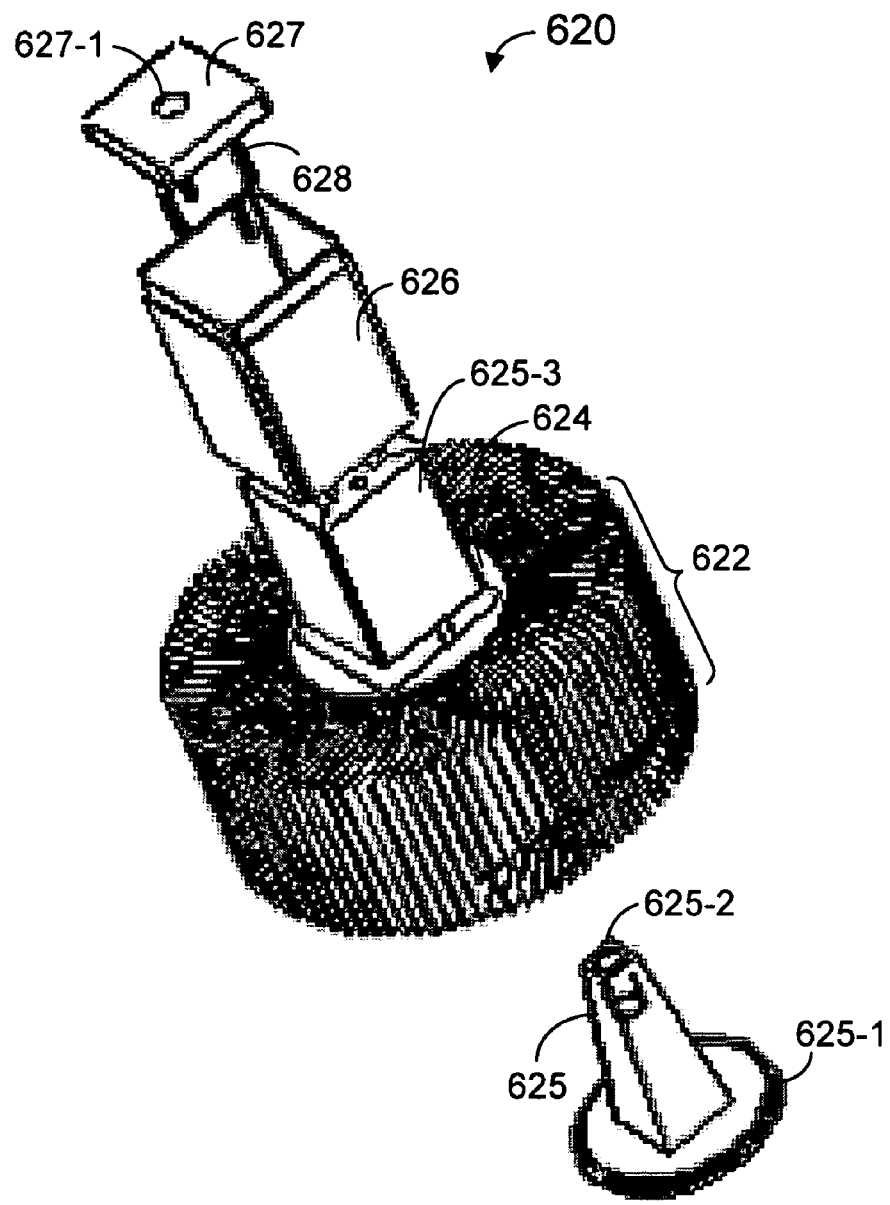
FIG. 8 is an exploded view of a system according to some embodiments.
Figure 9:
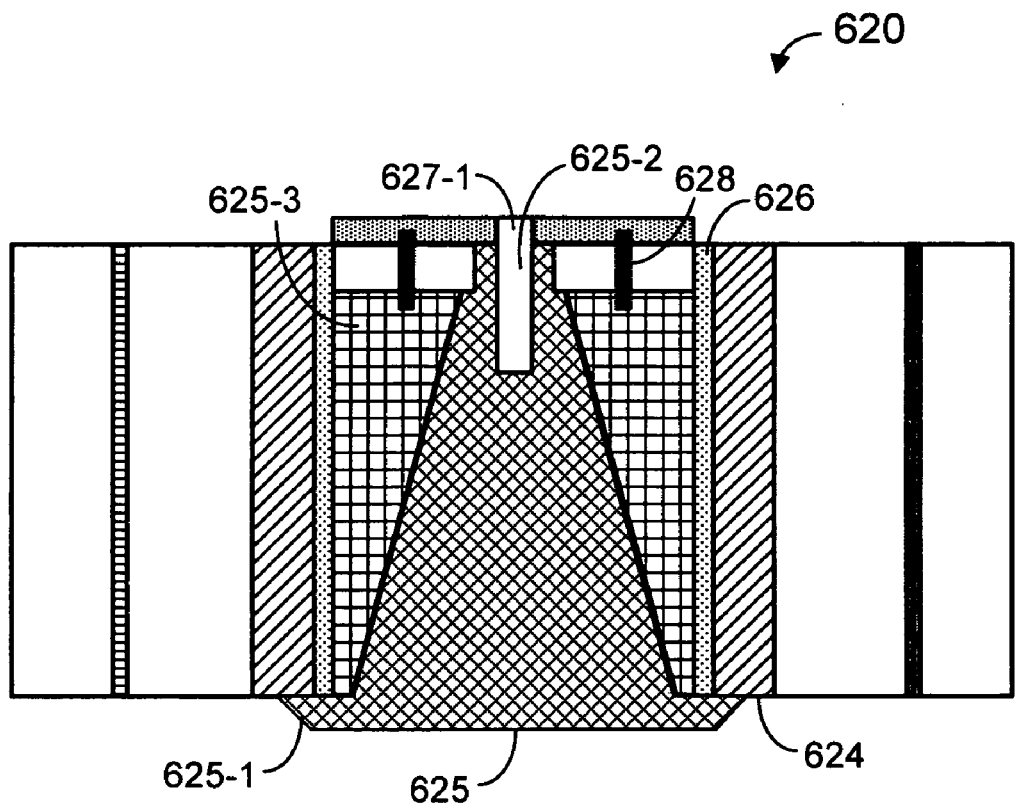
FIG. 9 is a cross-sectional diagram of the FIG. 8 system according to some embodiments.

FIGS. 8 and 9 show an exploded diagram and a cross-sectional diagram, respectively, of heat sink 620 according to some embodiments. Elements of heat sink 620 may be composed similarly to corresponding elements of heat sinks 120, 220, 420 and 520 described in conjunction with any of FIG. 1 through FIG. 7. According to some embodiments, the components of heat sink 620 may be similar in configuration and/or functionality to the similarly-named components described in conjunction with the aforementioned heat sinks.

In detail, heat sink 620 comprises portion 625, thermally-conductive unit 622, insert 625-3, TEC modules 626, stop 627 and fasteners 628. Heat sink 620 will be described as having a core comprising portion 625 and insert 625-3.

A width of a first end of portion 625 may be smaller than a width of a second end of portion 625. As shown in FIG. 9, insert 625-3 defines a tapered cavity to accept tapered portion 625. Accordingly, a first side of each of TEC modules 626 may be in contact with one side of insert 625-3, while a second side of each of TEC modules 626 may be in contact with base 624 of unit 622. Insert 625-3 may facilitate manufacture of heat sink 620 in comparison at least to heat sink 520.

Heat sink 620 also includes stop 627 in contact with at least unit 622. Stop 627 may facilitate biasing portion 625 against insert 625-3, insert 625-3 against TEC modules 626, and/or TEC modules 626 against base 624 of unit 622. Stop 627 defines opening 627-1 to pass a fastener that may be received by receptacle 625-2 and thereby secured to portion 625. The fastener may be tightened to bias portion 625 toward stop 627. Fasteners 628 may secure stop 627 to insert 625-3 in a case that no fastener is received by receptacle 625-2 of portion 625.

The several embodiments described herein are solely for the purpose of illustration. Therefore, persons in the art will recognize from this description that other embodiments may be practiced with various modifications and alterations.

What is claimed is:

1. An apparatus comprising:
   a thermally-conductive heat sink core having at least one surface;
   a solid-state heat pump including a first surface and a second surface, the first surface in contact with the at least one surface of the core; and
   a thermally-conductive unit in contact with the second surface of the solid-state heat pump;
   wherein the thermally-conductive heat sink core comprises a tapered copper portion and an insert defining a tapered cavity to accept the tapered copper portion.

2. An apparatus according to claim 1, wherein the thermally-conductive unit comprises a radial fin heat sink.

3. An apparatus according to claim 2, wherein the thermally-conductive heat sink core comprises copper, and
   wherein the thermally-conductive unit comprises aluminum.

4. An apparatus according to claim 1, wherein the thermally-conductive unit defines a cavity, and wherein the thermally-conductive heat sink core and the solid-state heat pump are disposed within the cavity.

5. An apparatus according to claim 4, wherein the thermally-conductive heat sink core comprises copper, and
   wherein the thermally-conductive unit comprises aluminum.

6. An apparatus according to claim 1, wherein a width of a first end of the thermally-conductive heat sink core is smaller than a width of a second end of the thermally-conductive heat sink core.

7. An apparatus according to claim 6, wherein the thermally-conductive unit defines a cavity, and wherein a width of a first end of the cavity is smaller than a width of a second end of the cavity.

8. An apparatus according to claim 6, further comprising:
   a device to bias the at least one surface of the core against the first surface of the solid-state heat pump, and to bias the second surface of the solid-state heat pump against the thermally-conductive unit.

9. An apparatus according to claim 8, the device comprising:
   a stop in contact with the thermally-conductive unit, disposed at least partially over the first end of the cavity, and defining an opening; and
   a fastener passing through the cavity, in contact with the core, and to bias the core toward the stop.

10. An apparatus according to claim 9, wherein the thermally-conductive unit comprises an aluminum radial fin heat sink, and
    wherein the thermally-conductive heat sink core comprises copper.

11. An apparatus according to claim 1, further comprising:
a device to bias at least one surface of the tapered copper portion against the insert.

12. An apparatus according to claim 11, the device comprising:
a stop in contact disposed at least partially over a first end of the cavity, and defining an opening; and
a fastener passing through the cavity, in contact with the tapered copper portion, and to bias the tapered copper portion toward the stop.

13. An apparatus according to claim 1, wherein the solid-state heat pump comprises a heat pump to carry heat from the first surface to the second surface.

14. An apparatus according to claim 1, wherein the first surface is a cold surface of the solid-state heat pump and wherein the second surface is a hot surface of the solid-state heat pump.

15. An apparatus according to claim 1, wherein the solid-state heat pump comprises a TEC module.

16. An apparatus according to claim 15, wherein the TEC module comprises a TEC module to receive DC power to cause one side of the TEC module to decrease in temperature and an opposite side of the TEC module to increase in temperature.

17. A method comprising:
coupling a first surface of a solid-state heat pump to at least one surface of a thermally-conductive heat sink core; and
coupling a second surface of the solid-state heat pump to a thermally-conductive unit;
wherein the first surface of the solid state heat pump is in contact with the at least one surface of the core;
wherein the second surface of the solid state heat pump is in contact with the thermally conductive unit; and
wherein the thermally-conductive heat sink core comprises a tapered copper portion and an insert defining a tapered cavity to accept the tapered copper portion.

18. A method according to claim 17, wherein the thermally-conductive unit comprises a radial fin heat sink.

19. A method according to claim 18, wherein the thermally-conductive heat sink core comprises copper, and wherein the thermally-conductive unit comprises aluminum.

20. A method according to claim 17, wherein coupling the second surface of the solid-state heat pump to the thermally-conductive unit comprises:
placing the thermally-conductive heat sink core and the solid-state heat pump within a cavity defined by the thermally-conductive unit.

21. A method according to claim 20, wherein the thermally-conductive heat sink core comprises copper, and wherein the thermally-conductive unit comprises aluminum.

22. A method according to claim 17, wherein a width of a first end of the thermally-conductive heat sink core is smaller than a width of a second end of the thermally-conductive heat sink core.

23. A method according to claim 22, wherein the thermally-conductive unit defines a cavity, and wherein a width of a first end of the cavity is smaller than a width of a second end of the cavity.

24. A method according to claim 22, further comprising:
biasing the at least one surface of the core against the first surface of the solid-state heat pump and the second surface of the solid-state heat pump against the thermally-conductive unit.

25. A method according to claim 24, wherein the biasing comprises:
placing a stop in contact with the thermally-conductive unit and at least partially over the first end of the cavity;
placing a fastener through an opening defined by the stop; and
securing the fastener to the core to bias the core toward the stop.

26. A system comprising:
a microprocessor package comprising a die and an integrated heat spreader;
a thermally-conductive heat sink core having a first surface in contact with the integrated heat spreader and a second surface;
a solid-state heat pump including a third surface and a fourth surface, the third surface in contact with the second surface of the core; and
a thermally-conductive unit in contact with the fourth surface of the solid-state heat pump; and
a double data rate memory electrically coupled to the die;
wherein the thermally-conductive unit defines a cavity, and wherein the thermally-conductive heat sink core and the solid-state heat pump are disposed within the cavity.

27. A system according to claim 26, wherein a width of a first end of the thermally-conductive heat sink core is smaller than a width of a second end of the thermally-conductive heat sink core.

28. A system according to claim 27, further comprising:
a device to bias the second surface of the core against the third surface of the solid-state heat pump, and to bias the fourth surface of the solid-state heat pump against the thermally-conductive unit.

29. A system according to claim 28, the device comprising:
a stop in contact with the thermally-conductive unit, disposed at least partially over the first end of the cavity, and defining an opening; and
a fastener passing through the cavity, in contact with the core, and to bias the core toward the stop.

30. A system comprising:
a microprocessor package comprising a die and an integrated heat spreader;
a thermally-conductive heat sink core having a first surface in contact with the integrated heat spreader and a second surface;
a solid-state heat pump including a third surface and a fourth surface, the third surface in contact with the second surface of the core; and
a thermally-conductive unit in contact with the fourth surface of the solid-state heat pump; and
a double data rate memory electrically coupled to the die;
wherein the thermally-conductive heat sink core comprises a tapered copper portion and an insert defining a tapered cavity to accept the tapered copper portion.

31. A system according to claim 30, further comprising:
a device to bias at least one surface of the tapered copper portion against the insert.

32. A system according to claim 31, the device comprising:
a stop in contact disposed at least partially over a first end of the cavity, and defining an opening; and
a fastener passing through the cavity, in contact with the tapered copper portion, and to bias the tapered copper portion toward the stop.

* * * * *